United States Patent [19]

Bahng et al.

[11] Patent Number: 5,194,868
[45] Date of Patent: Mar. 16, 1993

[54] DUAL SLOPE INTEGRATING A/C CONVERTER

[75] Inventors: Sam-Yong Bahng; Suk-Ki Kim, both of Buchun, Rep. of Korea

[73] Assignee: Samsung Electronics Co., Ltd., Suweon, Rep. of Korea

[21] Appl. No.: 739,674

[22] Filed: Aug. 2, 1991

[30] Foreign Application Priority Data

Apr. 13, 1991 [KR] Rep. of Korea .................. 91-5945

[51] Int. Cl.⁵ ...................... H03M 1/52; H03M 1/06
[52] U.S. Cl. .................................. 341/167; 341/118
[58] Field of Search .............. 341/166, 167, 118, 128

[56] References Cited

U.S. PATENT DOCUMENTS

| | | | |
|---|---|---|---|
| 4,031,533 | 6/1977 | Neumann | 341/167 |
| 4,303,880 | 12/1981 | Munt et al. | 341/167 |
| 4,556,867 | 12/1985 | George | 341/118 |
| 4,568,913 | 2/1986 | Evans | 341/118 |
| 4,633,221 | 12/1986 | Bradshaw et al. | 341/167 |
| 4,707,680 | 11/1987 | Sparrowhawk | 341/133 |
| 4,739,305 | 4/1988 | Naito | 341/118 |
| 4,771,265 | 9/1988 | Okui et al. | 341/167 |
| 4,851,839 | 7/1989 | Reinke | 341/128 |

Primary Examiner—Marc Hoff
Attorney, Agent, or Firm—Cushman, Darby & Cushman

[57] ABSTRACT

An improved dual slope integrating analog-to-digital converter for use in a Digital Multi-Meter includes an input portion, an A/D core portion, and a digital portion. The A/D core portion includes an auto zero function capability for automatically compensating for any existing offset voltages in various measurement modes such as voltage, resistance, or current measurement modes. The improved A/D converter of the present invention operates at high speed and with high resolution.

4 Claims, 7 Drawing Sheets

DUAL SLOPE INTEGRATING A/C CONVERTER

BACKGROUND OF THE INVENTION

1. Field of the Invention

The present invention relates to an A/D converter for converting an analog signal into a digital signal. Particularly, an A/D converter with a high resolution of "X10 Mode" which is capable of providing a Ratio Metric Reading by cancelling an offset voltage in response to an application of a "Auto-Zero function.

2. Description of the Art

In general, a resolution of a dual slope integrating A/D converter employed in a Digital Multi-Meter (DMM) is 3½ digits. But, in a dual slope A/D converter having a 3½ digit resolution, a residual electric charge zero crossing can be charged by a capacitor of predetermined capacitance to multiply a voltage by ten times. The multiplied value is deintegrated again such that the resolution of the dual slope A/D converter is 4½ digits or more.

Figure 1A:
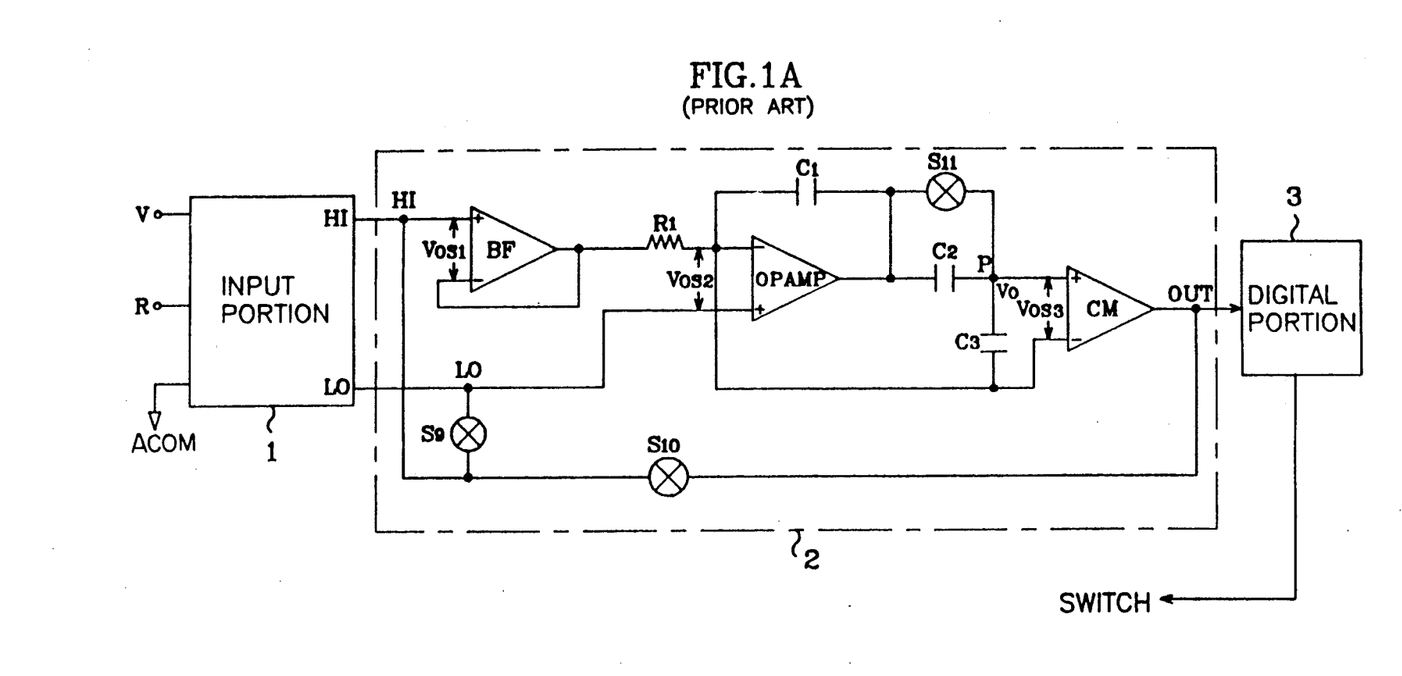
FIG. 1A is a circuit diagram of a conventional dual slope integrating A/D converter.

The above mentioned mode is called "X10 Mode". A conventional dual slope integrating A/D converter applying the X10 Mode is shown in FIG. 1A. This converter comprises input portion 1, A/D core portion 2, and digital portion 3.

Figure 1B:
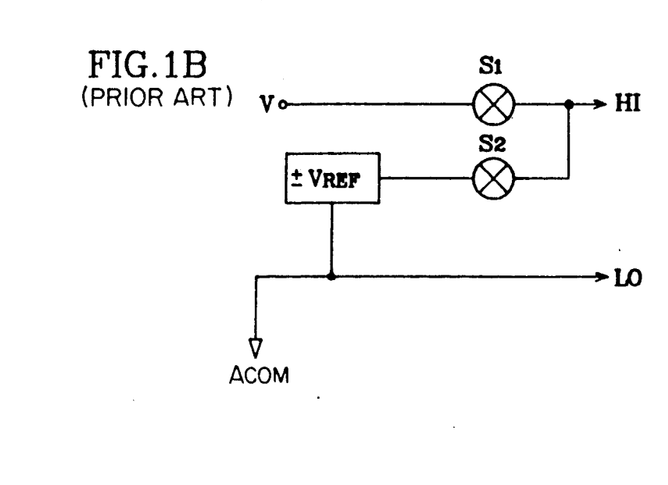
FIG. 1B is a detailed circuit diagram of an input portion for performing voltage measurements in a dual slope integrating A/D converter.
Figure 1C:
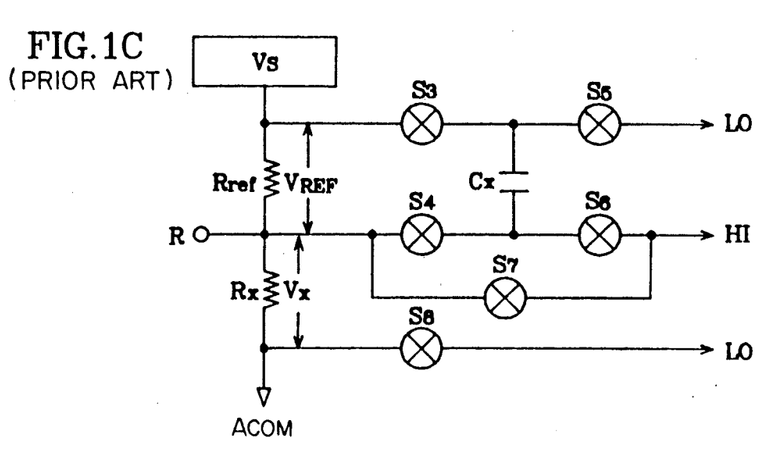
FIG. 1C is a detailed diagram of an input portion for performing resistance measurements in a dual slope integrating A/D converter.

For a voltage measurement, input portion 1 will include mainly two switches $S_1$ and $S_2$ and a reference voltage $\pm V_{REF}$ as shown in FIG. 1B. For a resistance measurement, input portion 1 will include mainly a supply power source, switches $S_3$ to $S_8$, a reference resistor $R_{ref}$, a capacitor $C_x$, and a measured resistor $R_x$ as shown in FIG. 1C.

A/D core portion 2 comprises a buffer BF, and operational amplifier (OP AMP), a comparator CM, switches $S_9$ to $S_{11}$, a resistor $R_1$, and a capacitor $C_1$ to $C_3$.

Figure 1D:
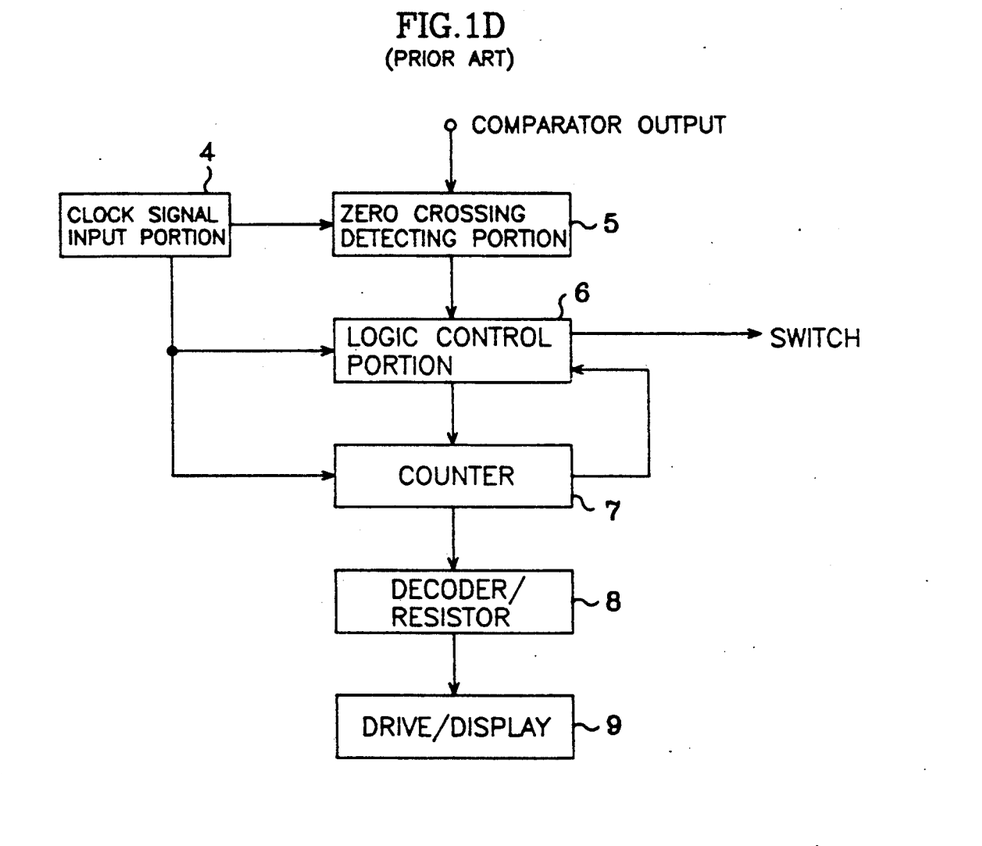
FIG. 1D is a schematic block diagram of a digital portion for a dual slope integrating A/D converter.

As shown in FIG. 1D, digital portion 3 comprises a clock signal input portion 4, a zero crossing detecting portion 5, a logic control portion 6, a decoder/resistor 8, and a drive/display portion 9.

The conventional dual slope A/D converter comprising the above-mentioned constituent elements for performing a voltage measurement operation, connects the portion measuring voltage between a power source terminal V and a common terminal Acom in FIG. 1B. Reference voltage $\pm V_{REF}$ is employed as the voltage for discharging the electric charge charged by integrating capacitor $C_1$ of A/D core portion 2 shown in FIG. 1A by way of the common terminal. In this manner, the discharged electric charge quantity can be regulated.

If a measured voltage $C_{IN}$ has a negative polarity, a reference voltage $\pm V_{REF}$ is supplied, and if the measured Voltage $V_{IN}$ is a positive polarity, a reference voltage $-V_{REF}$ is supplied.

For performing a resistance measurement, input portion 1 resembles a ratio metric reading circuit. A supply power source $V_s$, a reference resistor $R_{ref}$, a resistance measuring portion (that is, resistor $R_x$), and common terminal $A_{COM}$ are all connected in series as shown in FIG. 1C. As a current flows through this series circuit, a voltage drop across reference resistor $R_{ref}$ will be represented as $V_{ref}$ and a voltage drop across resistor $R_x$ will be represented as $V_x$.

Reference resistor $R_{ref}$ is connected to capacitor $C_x$ through switches $S_3$ and $S_4$. One terminal of capacitor $C_x$ is connected to an output terminal LO through switch $S_5$. The other terminal of capacitor $C_x$ is connected to an output terminal HI through switch $S_6$.

As input terminal R is connected to output terminal HI through switch $S_7$ and terminal $A_{com}$ is connected to output terminal LO through switch $S_8$, the voltage charge in capacitor $C_x$ is deintegrated.

Figure 2:
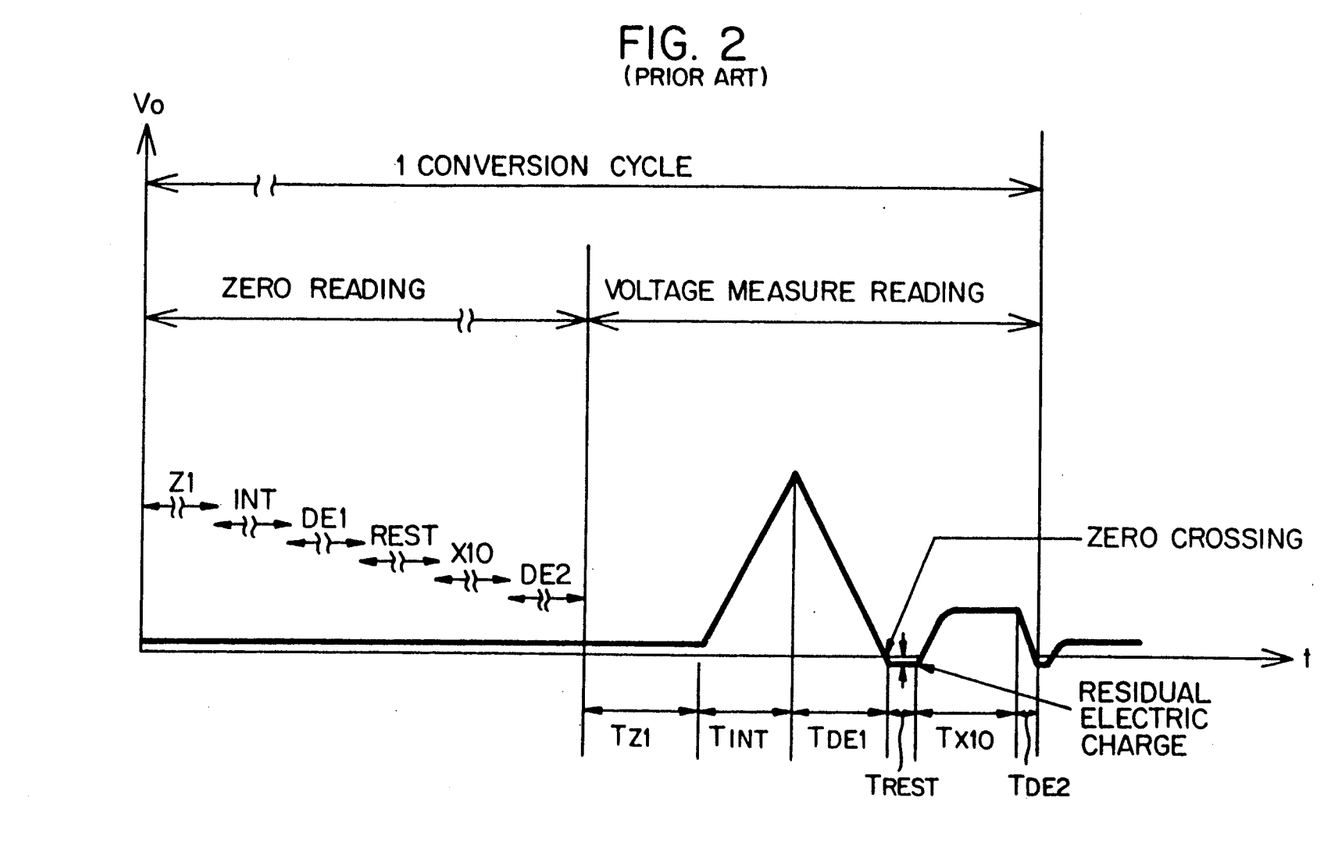
FIG. 2 is a waveform chart showing an output signal of a conventional dual slope integrating A/D converter.

On the other hand, the conversion operation is performed by a conversion cycle defined as shown in FIG. 2. The conversion cycle includes a zero integration phase Z1, an integration phase INT, a first deintegration phase DE1, a REST phase, X10 phase, and a second deintegration phase DE2.

In order to display the difference between the value converting the offset voltage and the value converting the following input $V_{IN}$ (the measured voltage), first the power source terminal V must be shorted at the common terminal (that is, the zero reading). Then it can receive the input $V_{IN}$.

Let us define the operating time during zero integration phase ZI as $T_{ZI}$. During a voltage measurement operation, if switches $S_9$ and $S_{10}$ of A/D core portion 2 in FIG. 1A are closed during zero integration phase Z1, the voltage $V_o$ at node P during zero integration phase Z1 can be expressed by the following equation.

$$V_o|T_{ZI} = \frac{(V_{os1} - V_{os2})}{R_1 \cdot C_1} = T_{ZI} + (V_{os2} + V_{os3}) \quad (1)$$

Therefore, you will find that the voltage $V_o$ at node P varies with a change in $T_{zI}$.

Let us now define the operating time during integration phase INT as $T_{INT}$.

If switch $S_1$ in FIG. 1B is closed during integration phase INT, a current will flow through buffer BF, resistor $R_1$ and capacitor $C_1$ of A/D core portion 2 in FIG. 1A. As a result, the voltage $V_o$ at node P is changed. At this time, the change $(\Delta V_o)$ is expressed by the following equation:

$$V_o|T_{INT} = \frac{(V_{IN} - V_{os1} + V_{os2})}{R_1 \cdot C_1} T_{INT} \quad (2)$$

The first deintegration phase DE1 is operated from the application of reference voltage $-V_{REF}$ till the beginning of the zero crossing.

Let us define the operating time in first deintegration phase DE1 as $T_{DE1}$. The change $(\Delta V_o)$ of voltage $V_o$ at node P can be expressed by the equation:

$$\Delta V_o|T_{DE1} = \frac{(-V_{REF} - V_{os1} + V_{os2})}{R_1 \cdot C_1} T_{DE1} \quad (3)$$

The amount of voltage change at the moment a zero crossing becomes "0" can be expressed by the equations:

$$V_o|T_{INT} + V_o|T_{DE1} = 0 \quad (4)$$

and $$T_{DE1} = \left( \frac{-V_{IN} - V_{os1} + V_{os2}}{V_{REF} + V_{os1} - V_{os2}} \right) T_{INT} \quad (5)$$

In Eq. 5, if reference voltage ($V_{REF}$) is regulated and $V_{REF} + V_{os1} - V_{os2}$ equals $V_{REF}$, Eq. 5 can be expressed by the equation:

$$T_{DE1} = \frac{V_{IN} - V_{os1} + V_{os2}}{V_{REF}} \quad (6)$$

Therefore, if a zero reading is performed first and $$T_{DE(zero\ reading)} = \frac{(V_{os1} - V_{os2})}{V_{REF}} T_{INT}$$

the offset voltage can be cancelled by $T_{DE1} - T_{DE}$(zero reading).

That is, $T_{DE}$ is expressed by the equation.

$$T_{DE} = \frac{V_{IN}}{V_{REF}} T_{INT},$$

where $V_{REF}$ equals $V_{REF} + V_{os2}$, and $T_{INT}$ is a fixed time.

Next, let us define the operating time during the REST phase as $T_{REST}$. If switch S9 of A/D core portion 2 in FIG. 1A is closed during the REST phase, the residual electric charge stored in capacitor S3 will be kept during the REST phase.

At this time, the voltage across capacitor C1 becomes the same voltage as that across capacitor C3.

During the X10 phase, switch S10 of A/D core portion 2 is closed and switch S11 is opened. Then, the output of comparator CM is fedback to buffer BF and operational amplifier OP AMP as the residual electric charges in capacitor C3 is transferred to capacitor C2. The multiplied voltage at node P varies with the capacitance of capacitors C2 and C3.

As the capacitance of capacitor C3 reaches a value ten times greater than the capacitance of capacitor C2, the voltage applied across capacitor C2 becomes ten times greater than that across capacitor C3.

The Second integration phase DE2 discharges the multiplied voltage $V_o$ at node P and counts the time for zero crossing to begin. As the counted time and time $T_{DE1}$ for first deintegration phase DE1 is calculated, a resolution of X10 can be obtained.

The operating condition of the switches in each conversion cycle is shown by the following table 1.

TABLE 1

| Phase | The operating condition of the switches during each conversion cycle: | | | | | | | | | |
|---|---|---|---|---|---|---|---|---|---|---|
| | Drawings | | | | | | | | | |
| | FIG. 1A | | | FIG. 1B | | FIG. 1C | | | | |
| | Switch | | | | | | | | | |
| | S9 | S10 | S11 | S1 | S2 | S3 | S4 | S5 | S6 | S7 | S8 |
| ZI | C | C | O | O | O | C | C | O | O | O | O |
| INT | O | O | C | C | O | C | C | O | O | C | C |
| DE1 | O | O | C | O | O | O | O | C | C | O | O |
| REST | C | O | C | O | O | C | C | O | O | O | O |
| X10 | O | C | O | O | O | C | C | O | O | O | O |
| DE2 | O | O | C | O | C | O | O | C | C | O | O |

C represents a switch is closed, and
O represents a switch is opened.

Up to now we have described the operation for a voltage measurement operation. A conversion cycle for a resistance measurement operation progresses very much like that for a voltage measurement operation.

For a resistance measurement operation, during the zero integration phase Z1, the measuring register $R_x$ is connected between input terminal R and common terminal ACOM as shown in FIG. 1C such that supply power source $V_s$ is applied through reference resistor $R_{ref}$. The current $I_s$ through measuring resistor $R_x$ is therefore expressed by the following equation:

$$I_s = \frac{V_s}{R_{ref} + R_x}$$

Switches S5 and S6 are closed during the integration phase INT such that voltage $V_x$ applied across measuring resistor $R_x$ is integrated.

Voltage $V_{REF}$ applied across reference resistor $R_{REF}$ in FIG. 1C is expressed by the equation:

$$V_{REF} = \frac{V_s}{R_{ref} + R_x} R_{ref}$$

Switches S5 and S6 are closed during the first deintegration phase DE1 such that voltage $V_o$ at node P integrated by voltage $V_x$ is discharged again.

The first deintegration phase DE1 is operated until the zero crossing begins. At this point, $T_{DE1}$ is calculated during the first deintegration phase DE1. $T_{DE1}$ is expressed by the equation:

$$T_{DE1} = \frac{\frac{V_s}{R_{ref} + R_x} R_x - (V_{os1} - V_{os2})}{\frac{V_s}{R_{ref} + R_x} R_{ref} + (V_{os1} - V_{os2})} T_{INT}$$

It should be noted that $$\frac{V_s}{R_{ref} + R_x} R_{ref}$$

varies in response to a change of measuring resistor $R_x$. Therefore, although it provides the zero reading, the offset voltage $V_{os1} - V_{os2}$ is not cancelled.

The conventional dual slope A/D converter has the following problems.

The conventional dual slope A/D converter operating as mentioned above is in need of a zero reading step, therefore the conversion time during each conversion cycle is lengthened. As a result, its operating speed is slow. Further, as the offset voltage is not completely cancelled in a ratio metric reading, it is very difficult to obtain high resolution.

SUMMARY OF THE INVENTION

The object of the present invention which overcomes the above-mentioned problems of the conventional dual slope A/D converter is to provide a dual slope integrating A/D converter which has a fast operating speed and a resolution of 4½ digits and up.

To achieve the above objects, according to the present invention, a dual slope integrating A/D converter comprises an input portion 11; and A/D core portion 12 which includes a buffer BF and an operational amplifier (OP AMP) for respectively receiving an output of input portion 11, a resistor R1 connected to the output terminal of the buffer BF, an auto zero capacitor $C_{AZ}$ connected between resistor R1 and operational amplifier OP AMP, a capacitor C1 for charging an offset voltage and integrating the input voltage using resistor R1, a capacitor C2 for amplifying the voltage $V_o$ at node P with a residual electric charge, a capacitor C3 for charging the residual electric charge, a comparator CM, and a switch $S_A$ to $S_c$ and S9 to S11; a digital portion 13 for inputting the output of A/D core portion 12 in which swithces $S_A$ to $S_D$ and $S_1$ to $S_{11}$ are driven by generated control signals AZ, INT, DE1, REST, Z10, X10, REX, and DE2.

Here, the constitution of input portion 11 includes the same circuits as that of the conventional input portion 1 shown in FIGS. 1B and 1C for voltage and resistance measurement operations, respectively. The constitution of the digital portion 13 of the present invention also includes the same circuit as that of the conventional digital portion 13 shown in FIG. 1D.

BRIEF DESCRIPTION OF THE DRAWINGS

The above object and feature of the present invention will be apparent from the following description of the preferred embodiment with reference to the accompanying drawings.

DESCRIPTION OF THE PREFERRED EMBODIMENTS

The constitution, function and effect of the present invention will be explained in detail with reference to the accompanying drawings.

Figure 3:
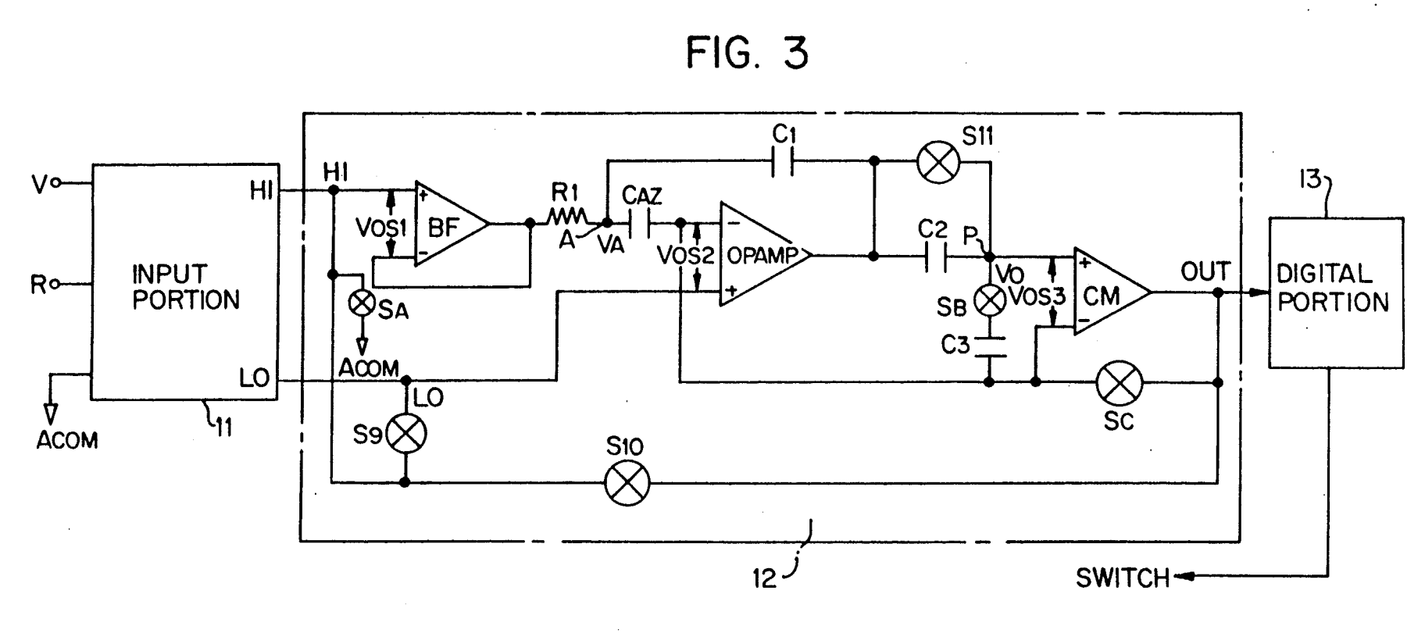
FIG. 3 is a circuit diagram of a dual slope integrating A/D converter of the present invention.
Figure 4:
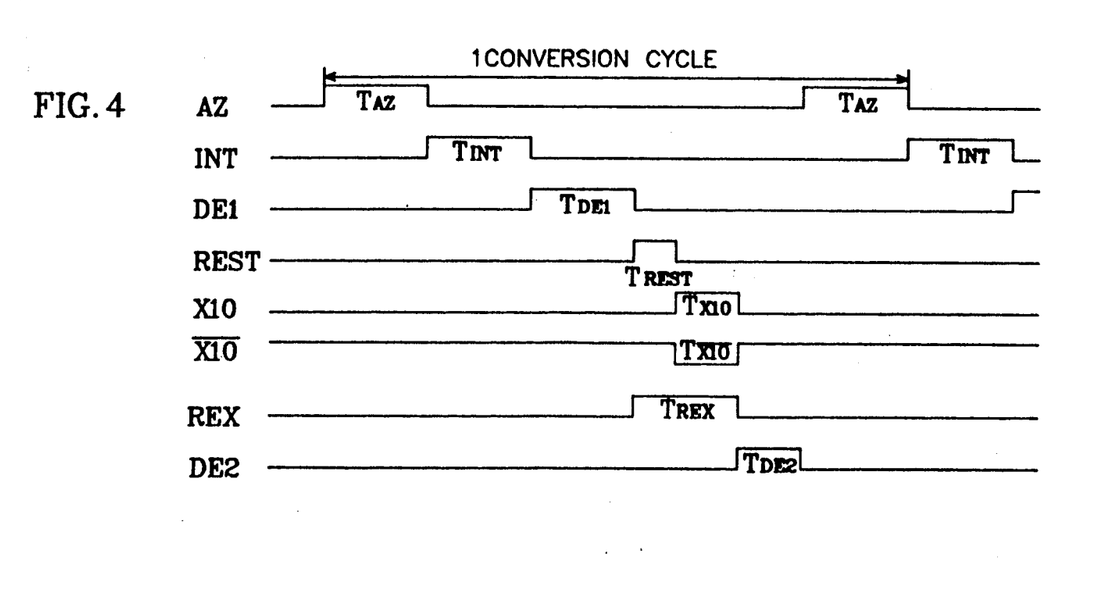
FIG. 4 is a waveform chart of a switch controlling signal.
Figure 5:
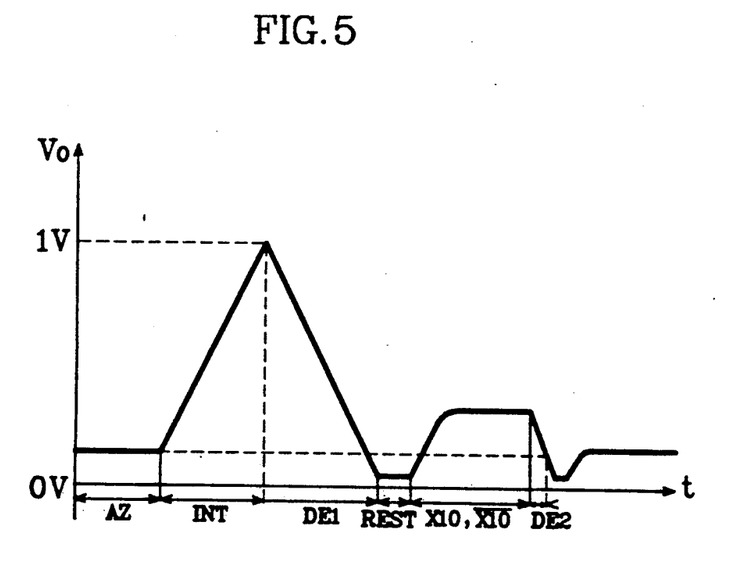
FIG. 5 is a waveform chart illustrating an output signal of the present invention.

FIG. 3 is a circuit diagram showing a constitution of the dual slope integrating A/D converter of the present invention. FIG. 4 is a waveform diagram showing the controlling signal regulating the switches shown in FIG. 3. FIG. 5 is a waveform diagram showing the output signal of the dual slope integrating A/D converter of the present invention.

An offset voltage is charged by auto zero capacitor $C_{AZ}$ and capacitor $C_1$ in A/D core portion 12 during an auto zero phase AZ. Input voltage $V_{IN}$ is integrated through resistor R1 and capacitor C1 during an integration phase INT.

The charged voltage is discharged as reference voltage $\pm V_{REF}$ during a first deintegration phase DE1. Thereafter, the residual electric charge is charged to capacitor $C_3$ and proceeds to capacitor $C_2$ during a REX phase and a REST phase such that the residual electric charge serves to amplify voltage $V_o$ at node P.

First, the operation and constitution of the circuit during the auto zero phase will be explained. Input terminal HI of A/D core portion 12 is connected to common terminal $A_{COM}$ by switch $S_A$. The switch $S_B$ is opened, and the switch $S_{11}$ is closed. The output of comparator CM is also feedback to the negative terminal of buffer BF by switch $S_c$. At such point, capacitor $C_3$ is separated from the positive input of comparator CM such that capacitor $C_3$ will have no influence on the circuit.

Voltage $V_A$ at node A at time $T_{AZ}$ is about $-V_{os1}$. $V_{os1}$ represents the offset voltage of buffer BF and a current flows through resistor $R_1$. At that instant, voltage $V_o$ at node P is expressed by the equation:

$$V_o|T_{AZ} = (V_{os2} + v_{o3}) \tag{A}$$

Also, during the integration phase INT, switch $S_1$ shown in FIG. 1B is closed such that the measured input voltage $V_{IN}$ is integrated. At this point, switches $S_A$, $S_B$, and $S_C$ are opened by switch controlling signals AZ and REX shown in FIG. 4, and voltages $V_A$ and $V_o$ at nodes A and P, respectively during the auto zero phase AZ are as follows:

$$V_A = V_{os1}, \text{ and } V_o = V_{os2} + V_{os3}$$

When an input voltage $V_{IN}$ is applied, the voltage applied across resistor $R_1$ is $(V_{IN} - V_{os1}) - V_A = V_{IN} - V_{os1} - (-V_{os1}) = V_{IN}$, and the offset voltage $V_{os1}$ is thus cancelled.

At this point, if the change of voltage $V_o$ at node P is to be represented as $\Delta V_o$, $\Delta V_o$ can be expressed by the equation:

$$V_o|T_{INT} = \frac{V_{IN}}{R_1 \cdot C_1} T_{INT}, \tag{B}$$

the voltage at node P being as follows:

$$V_o|T_{INT} = \frac{V_{IN}}{R_1 \cdot C_1} T_{INT} + (V_{os2} + V_{os3}) \tag{C}$$

Switch $S_2$ shown in FIG. 1B is closed by switch controlling signal DE1 during the first deintegration phase DE1. As a result, the electric charge charged to the reference voltage $V_{REF}$ is discharged and a zero crossing is performed.

At this point, the zero crossing voltage becomes the voltage at the auto zero phase $(V_o|T_{AZ} = V_{os2} + V_{os3})$ somewhat the polarity of the reference voltage $V_{REF}$ becomes the opposite of the polarity of the input voltage $V_{REF}$, so that the change $V_o$ of the voltage $V_o$ at the node P is expressed by the equation:

$$V_o|T_{DE1} = \frac{V_{REF}}{R_1 \cdot C_1} - T_{INT}, \tag{D}$$

voltage $V_o$ at node P in the zero crossing is expressed by the equation:

$$V_o|T_{INT} + T_{DE1} = V_o|T_{AZ} = V_{os2} + V_{os3}. \tag{E}$$

Therefore, Eq. (E) can be expressed by the equation:

$$V_o|T_{INT} + T_{DE1} = \frac{V_{IN}}{R_1 \cdot C_1} T_{INT} + (V_{os2} + V_{os3}) + \tag{F}$$

$$\frac{-V_{REF}}{R_1 \cdot C_1} T_{DE1} = V_{os2} + V_{os3}$$

Thus, if the time of $T_{DE1}$ satisfying $V_O|T_{INT} + T_{DE1} = V_O T_{AZ}$ is obtained, $T_{DE1}$ equals $$\frac{V_{IN}}{V_{REF}} T_{INT}.$$

Therefore, the offset voltage is completely cancelled. The offset voltage is cancelled irrespective of the strength of the input voltage $V_{IN}$ or that of the reference voltage $V_{REF}$, which is applicable to the ratio metric reading, that is, the resistance measurement operation.

And, during the REST phase, switches S9, S11, and $S_B$ are closed by the switch controlling signals REST, X10, and REX shown in FIG. 4, such that the residual electric charge is charged by the output voltage at node P after the zero crossing.

During the X10 phase, the switch controlling signals X10 and $\overline{X10}$ shown in FIG. 4 close the switch S10 and open the switch S11. However, since the capacitance of capacitor C3 is far more voluminous than that of capacitor C2, the electric charge C3 is far more voluminous than that of capacitor C2, the electric charge of capacitor C3 is transferred to capacitor C2, and the voltage Vo at the node P is multiplied according to the capacitance value of capacitors C2 and C3.

In order to multiply by ten the voltage Vo at the node P due to the residual electric charge, the capacitance of capacitor C3 must be ten times in comparison with that of the capacitor C2. That is, C3 must be equal $10 \times C_2$.

When the voltage $V_o$ at the node P is swung by the combination of the capacitors C3 and the auto zero capacitor $C_{AZ}$ during the X10 phase, the swung voltage is again applied to the voltage $V_A$ at the node A and produces the gain error.

In order to prevent this occurrence, switch $S_B$ is closed by the switch controlling signal REX shown in FIG. 4 only for the REST phase and the X10 phase and the REX phase is operated.

Also, during the second integration phase DE2, the voltage $V_o$ multiplied by the reference voltage $V_{REF}$ is deintegrated again so that the resolution may be improved.

Figure 6:
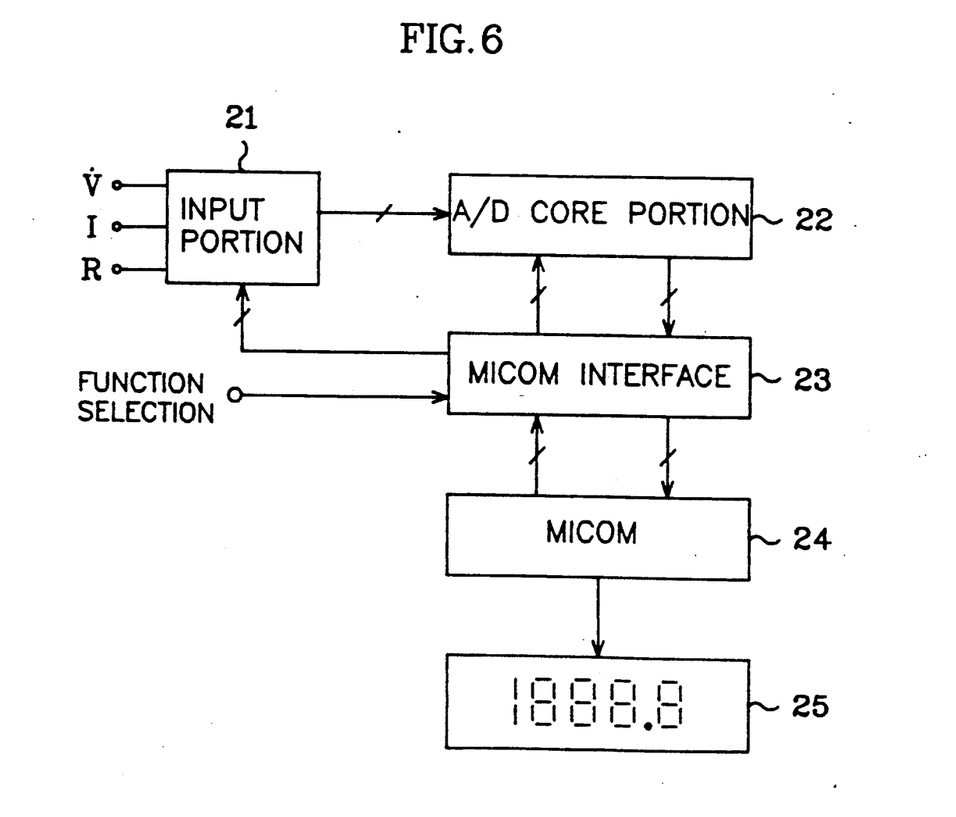
FIG. 6 is a block diagram illustrating a preferred embodiment of applying the present invention to a Digital Multi-Meter (DMM).

The operating condition of the switches during a conversion cycle are shown in Table 2.

is connected to input portion 21 so as to perform the auto range function.

The constitution of input portion 21 changes according to the selected operating measurement mode (i.e., a voltage V, a resistance R, a current I and so on). The MICOM 24 recognizes the function selection information and changes the constitution of the input portion 21. Here, the circuit must function such that the voltage for converting the common feature in measuring voltage V, resistance R or current I into the appropriate voltage may be output to the A/D core portion 22 and converted in the A/D core portion 22.

The A/D converter, which also includes a reference voltage $V_{REF}$ generator, provides the reference voltage $V_{REF}$ to the A/D core portion 22 and is regulated with an external minute value.

Also, the A/D core portion 22 converts the inputted voltage and transmits the zero crossing time to the MICOM interface 23.

The MICOM interface 23 transmits all control signals of the MICOM 24 to the input portion 21 and the A/D core portion 22 as well as those signals generated by the A/D core portion 22 to the MICOM 24.

The MICOM 24 generates the respective conversion cycle according to the constitution of the software, receives and calculates the zero crossing signal, and generates the digital signal or the signal performable display by driving LCD 25.

Therefore, the present system has the advantage that there can be added digital functions of memory including the specific functions of calculating minimum, maximum, and mean values by classifying a conversion cycle into its respective measuring mode or by utilizing an operation function.

As explained above, the dual slope integrating A/D converter of the present invention improves the operating speed of the circuit by obviating use of zero reading steps.

Further, the offset voltage is removed during an auto zero phase such that the dual slope integrating A/D converter of the present invention may be used in a DMM without difficulty.

Also, the present invention is such that the auto zero function can be added with little circuit modification to conventional A/D converter circuits with 3½ digit reso-

TABLE 2

The operating condition of the switches in a conversion cycle.

| | Drawings | | | | | | | | | | | | | |
|---|---|---|---|---|---|---|---|---|---|---|---|---|---|---|
| | FIG. 3 | | | | | | FIG. 1B | | | FIG. 1C | | | | |
| | Switch | | | | | | | | | | | | | |
| Phase | S9 | S10 | S11 | SA | SB | SC | S1 | S2 | S3 | S4 | S5 | S6 | S7 | S8 |
| AZ | O | O | C | C | O | C | O | O | C | C | O | O | O | O |
| INT | O | O | C | O | O | O | C | O | C | C | O | O | C | C |
| DEI | O | O | C | O | O | O | C | C | O | O | C | O | O | O |
| REST | C | O | C | O | C | O | O | O | C | C | O | O | O | O |
| REX | O | O | C | O | C | O | O | O | C | C | O | O | O | O |
| X10 | O | C | O | O | C | O | O | O | C | C | O | O | O | O |
| $\overline{X10}$ | O | O | C | O | C | O | O | O | C | C | O | O | O | O |
| DE2 | O | O | C | O | O | O | O | C | O | O | C | C | O | O |

C represents that a switch is closed.
O represents that a switch is opened.

FIG. 6 shows a preferred embodiment of the present invention. That is, in FIG. 6 is shown the present dual slope integrating A/D converter applied to a DMM of the MICOM type. The reduction function (not shown)

lution to serve as an A/D converter with 4½-digit resolution or more.

The present invention is not limited to the specifically disclosed embodiments, and variations and modifications may be made without departing from the scope of the present invention.

We claim:

1. A dual slope integrating analog-to-digital converter for cancelling an offset error signal during an auto zero phase of a conversion cycle of operation, said converter comprising:

input means for receiving a measurable input signal and generating a voltage signal in response thereto;

analog-to digital core means coupled to said input means and comprising:

a plurality of selectively disposed switching means responsive to a series of switching control signals, each set of switching control signals in said series corresponding to each of a plurality of phases in said conversion cycle, said analog-to-digital core means generating a zero-crossing signal upon completion of the auto phase of said conversion cycle;

a first capacitor for transferring a residual charge to a second capacitor in response to said offset error signal to multiply said residual charge with a voltage at a reference node disposed between said first and second capacitors, after said zero-crossing signal is detected, to generate a reference signal; and a comparator coupled to said reference signal for generating an output signal in response thereto;

digital output means for generating said series of switching control signals and for receiving the output signal from said analog-to-digital core means to generate a displayed output in response thereto.

2. A dual slope integrating analog-to-digital converter as in claim 1, wherein said analog-to-digital core means further comprises:

a buffer coupled to an operational amplifier;

a resistor connected to said buffer;

an auto zero capacitor connected to said resistor and said operational amplifier; and an integrating capacitor coupled tot he resistor, the operational amplifier, and the auto zero capacitor for changing the offset error signal and for integrating the voltage signal input from said input means.

3. A dual slope integrating analog-to-digital converter as in claim 1, wherein said analog-to-digital core means transfers said residual charge to said second capacitor during a REST phase of the conversion cycle.

4. A dual slope integrating analog-to-digital converter as in claim 1, wherein the capacitance of said second capacitor is larger than that of said first capacitor.

* * * * *